(12) United States Patent
Matsui

(10) Patent No.: US 9,263,104 B2
(45) Date of Patent: Feb. 16, 2016

(54) SEMICONDUCTOR DEVICE

(71) Applicant: Micron Technology, Inc., Boise, ID (US)

(72) Inventor: Yoshinori Matsui, Tokyo (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/184,566

(22) Filed: Feb. 19, 2014

(65) Prior Publication Data

US 2014/0241073 A1 Aug. 28, 2014

(30) Foreign Application Priority Data

Feb. 22, 2013 (JP) .................. 2013-033131

(51) Int. Cl.
| | |
|---|---|
| *G11C 7/00* | (2006.01) |
| *G11C 7/10* | (2006.01) |
| *G11C 11/4076* | (2006.01) |
| *G11C 11/4097* | (2006.01) |

(52) U.S. Cl.
CPC .............. *G11C 7/1078* (2013.01); *G11C 7/109* (2013.01); *G11C 11/4076* (2013.01); *G11C 11/4097* (2013.01); *G11C 2207/107* (2013.01)

(58) Field of Classification Search
None
See application file for complete search history.

(56) References Cited

U.S. PATENT DOCUMENTS

| | | | |
|---|---|---|---|
| 7,626,523 B2 | 12/2009 | Shin et al. | |
| 2011/0110176 A1* | 5/2011 | Lee et al. | ................. 365/230.06 |
| 2011/0115543 A1 | 5/2011 | Teramoto et al. | |
| 2012/0254650 A1* | 10/2012 | Park | ............................ 713/401 |

OTHER PUBLICATIONS

Notice of Preliminary Rejection for KR Appl. No. 10-2014-0014043, dated Aug. 12, 2015.

* cited by examiner

*Primary Examiner* — Kretelia Graham
(74) *Attorney, Agent, or Firm* — Dorsey & Whitney LLP

(57) ABSTRACT

Disclosed herein is an apparatus that includes: a first terminal configured to receive a serial write data signal that includes at least four bits transferred in series with each other; a second terminal configured to receive a data strobe signal; a control circuit configured to produce a plurality of internal data strobe signals in response to the data strobe signal; and a serial-to-parallel conversion circuit configured to respond to the data strobe and internal data strobe signals to convert the serial write data signal into a parallel write data signal that includes at least four bits produced in parallel to each other.

18 Claims, 19 Drawing Sheets

SEMICONDUCTOR DEVICE

BACKGROUND OF THE INVENTION

1. Field of the Invention

Embodiments of the present invention relate to a semiconductor device, and more particularly to a semiconductor device that includes a data input circuit that writes a plurality of write data sets that are supplied in serial to a memory cell array in parallel.

2. Description of Related Art

DRAM (Dynamic Random Access Memory) that is one of typical semiconductor storage devices generally includes a DLL (Delay Locked Loop) circuit to accurately perform high-speed data transfer with a memory controller. The DLL circuit generates a phase-controlled internal clock signal based on an external clock signal supplied from the memory controller. Because read data is output in synchronization with the phase-controlled internal clock signal, high-speed data transfer can be performed accurately.

However, the DLL circuit consumes relatively large amounts of power. Therefore, especially DRAMs that are required to consume small amounts of power for use in mobile devices may not include a DLL circuit. In the DRAM of this type, read data that has been parallel-to-serial converted by using an internal clock signal not phase-controlled is output to outside without being phase-controlled. Even during a writing operation, write data that has been input in synchronization with a data strobe signal is serial-to-parallel converted by using an internal clock signal not phase-controlled (See Japanese Patent Application Laid-Open No. 2011-108300).

Some of the DRAMs for mobile devices and the like adopt an edge-pad-type layout in which external terminals are arranged along two edges, that face each other, of a semiconductor chip. In this case, pads for command address signals are arranged along one edge of the two edges, and pads for data signals are arranged along the other edge of the two edges (See Japanese Patent Application Laid-Open No. 2011-108352).

However, in a semiconductor device having an edge-pad-type layout, peripheral circuits that perform command address operations are disposed away from peripheral circuits that perform data transfer operations. As a result, the length of a signal line is very long to connect those peripheral circuits. Accordingly, the signal line has a relatively large parasitic capacitance. Therefore, a charge-and-discharge current to drive the signal line becomes larger, and the amount of current consumed is increased.

SUMMARY

In one embodiment, there is provided a device that includes: a first terminal configured to receive a serial write data signal that includes at least four bits transferred in series with each other; a second terminal configured to receive a data strobe signal; a control circuit configured to produce a plurality of internal data strobe signals in response to the data strobe signal; and a serial-to-parallel conversion circuit configured to respond to the data strobe and internal data strobe signals to convert the serial write data signal into a parallel write data signal that includes at least four bits produced in parallel to each other.

In another embodiment, there is provided a device that includes: a first row of pads arranged in line and includes first and second pads that are configured to receive a first serial data signal and a first timing signal, respectively; a second row of pads arranged substantially in parallel to the first row of pads; an memory cell array being between the first and second rows of pads; a first control circuit configured to produce a plurality of second timing signals in response to the first timing signal; a first circuit configured to fetch the first serial data signal in response to the first timing signal and output a second serial data signal; and a second circuit configured to convert the second serial data signal to a parallel data signal in response to the second timing signals.

In still another embodiment, there is provided a device that includes: a first terminal operatively receiving a first serial write data signal that includes first and second write data, each of the first and second write data being at least two bits; second and third terminals operatively receiving first and second data strobe signals, respectively, the first and second data strobe signals being complementary to each other; a control circuit operatively producing a plurality of internal data strobe signals in response to at least one of the first and second data strobe signals; a first data latch coupled to the first terminal at an input node thereof and including first and second latches that are connected in series between the input node thereof and an output node thereof, the first latch operatively responding to the first data strobe signal to fetch the first write data, and the second latch operatively responding to the second data strobe signal to produce a second serial write data signal at the output node of the first data latch, the second serial write data signal including the first write data; a second data latch coupled to the first terminal at an input node thereof and including a third latch coupled between the input node thereof and an output node thereof, the third latch operatively responding to the second data strobe signal to fetch the second write data and to produce the third serial write data signal at the output node of the second data latch, the third serial write data signal including the second write data; a first converter coupled to the output node of the first data latch and operatively responding to the internal data strobe signals to convert the second serial write data signal into a first parallel write data signal; and a second converter coupled to the output node of the second data latch and operatively responding to the internal data strobe signals to convert the third serial write data into a second parallel write data signal.

DETAILED DESCRIPTION OF THE EMBODIMENTS

Embodiments of the present invention will be explained below in detail with reference to the accompanying drawings.

Figure 1:
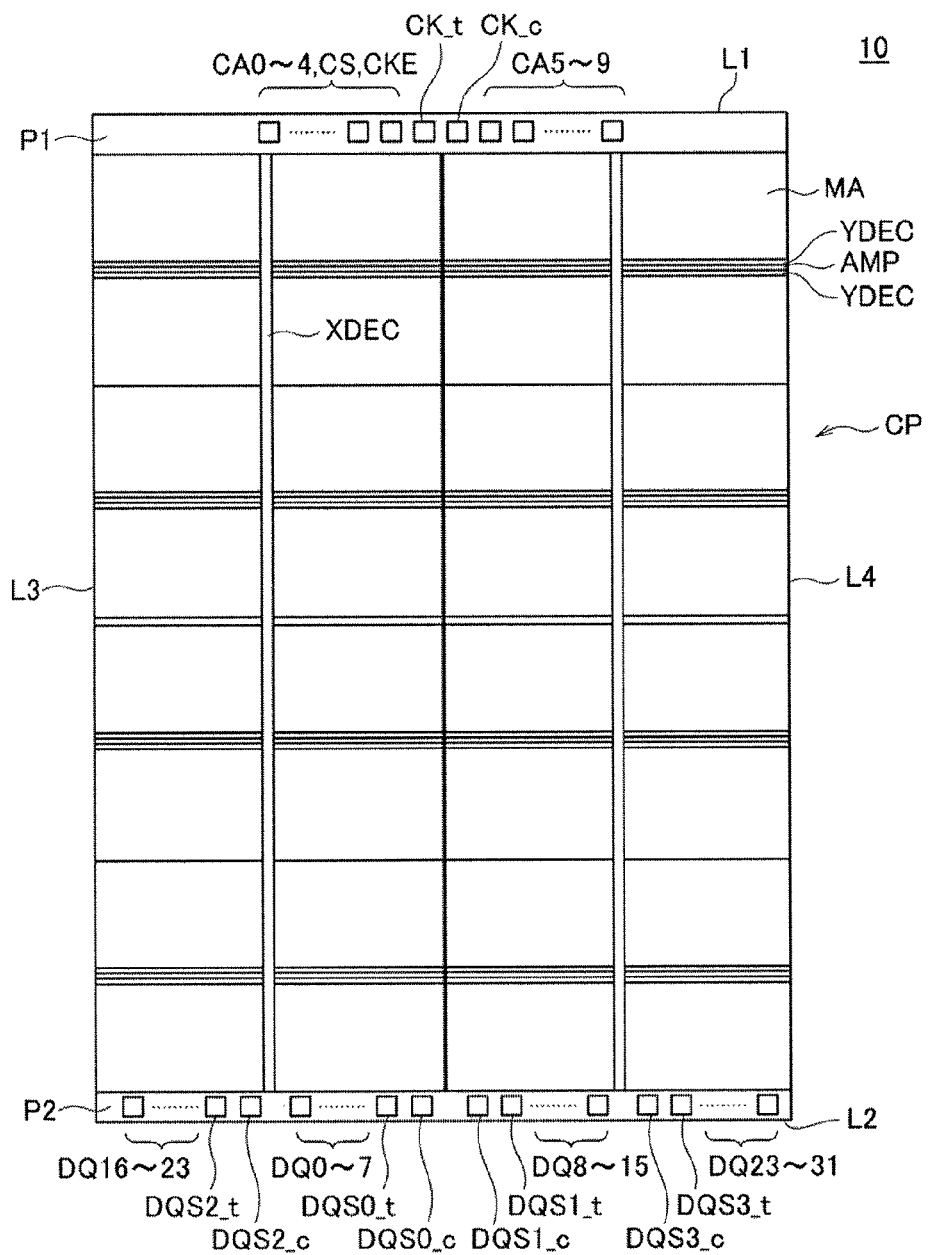
FIG. 1 is a schematic plane view illustrating a layout of a semiconductor device according to an embodiment of the present invention.

Referring now to FIG. 1, an apparatus includes a semiconductor device 100 according to an embodiment of the present invention. As used herein, apparatus may refer to, for example, an integrated circuit, a memory device, a memory system, an electronic device or system, a smart phone, a tablet, a computer, a server, etc. The semiconductor device 10 may be integrated on a single silicon chip CP. A main surface of the silicon chip CP is in a quadrilateral shape; the main surface has a first side edge L1 and a second side edge L2 that are parallel to each other, and a third side edge L3 and a fourth side edge L4 that are perpendicular to the side edges L1 and L2 and are parallel to each other. The semiconductor device 10 of the present embodiment includes a first peripheral circuit region P1 that is provided along the first side L1, and a second peripheral circuit region P2 that is provided along the second side L2. A memory cell array MA is disposed between the first peripheral circuit region P1 and the second peripheral circuit region P2.

Figure 2:
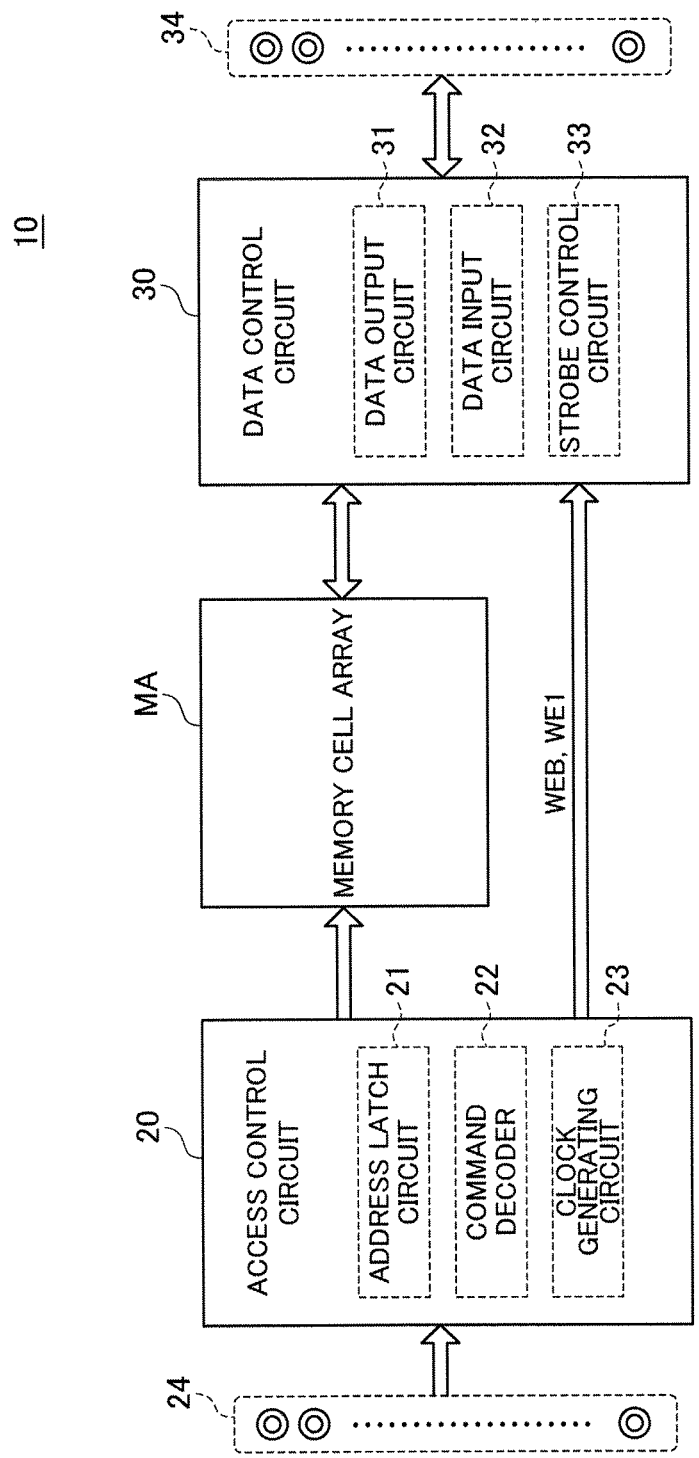
FIG. 2 is a block diagram showing the circuit configuration of the semiconductor device shown in FIG. 1.

The first peripheral circuit region P1 is a region in which a plurality of external terminals (Pads) 24 for command address signals shown in FIG. 2, and an access control circuit 20 that is related to the external terminals 24 are disposed. The external terminals 24 include clock terminals to which external clock signals CK_t and CK_c are supplied, command address terminals to which command address signals CA0 to CA9 are supplied, a chip select terminal to which a chip select signal CS is supplied, and a clock enable terminal to which a clock enable signal CKE is supplied. The access control circuit 20 includes an address latch circuit 21, a command decoder 22, and a clock generating circuit 23.

The second peripheral circuit region P2 is a region in which a plurality of external terminals (Pads) 34 for data signals shown in FIG. 2, and a data control circuit 30 that is related to the external terminals 34 are disposed. The external terminals 34 include data terminals DQ0 to DQ31 which are used to output read data and input write data, and strobe terminals which are used to input and output strobe signals DQS0t to DQS3t and DQS0c to DQS3c. The data control circuit 30 includes a data output circuit 31, a data input circuit 32, and a strobe control circuit 33.

The access control circuit 20 controls an operation of access to the memory cell array MA. For example, an address signal that is supplied from outside via the external terminals 24 is latched by the address latch circuit 21, and is supplied to row decoders XDEC or column decoders YDEC shown in FIG. 1. As a result, a certain memory cell to be accessed in the memory cell array MA is specified. A command signal that is supplied from the outside via the external terminals 24 is decoded by the command decoder 22 to generate various internal signals. For example, if the command signal indicates a reading operation, the read data that is read out from a memory cell specified by the row decoders XDEC and column decoders YDEC is amplified by main amplifiers AMP, and is transferred to the data output circuit 31. As a result, the read data that has been read out is output to the outside via the external terminals 34. If the command signal indicates a writing operation, the write data that has been input from the outside via the external terminals 34 is supplied to the data input circuit 32, and is transferred to the main amplifiers AMP. As a result, the write data is written into a memory cell specified by the row decoders XDEC and column decoders YDEC.

Figure 3:
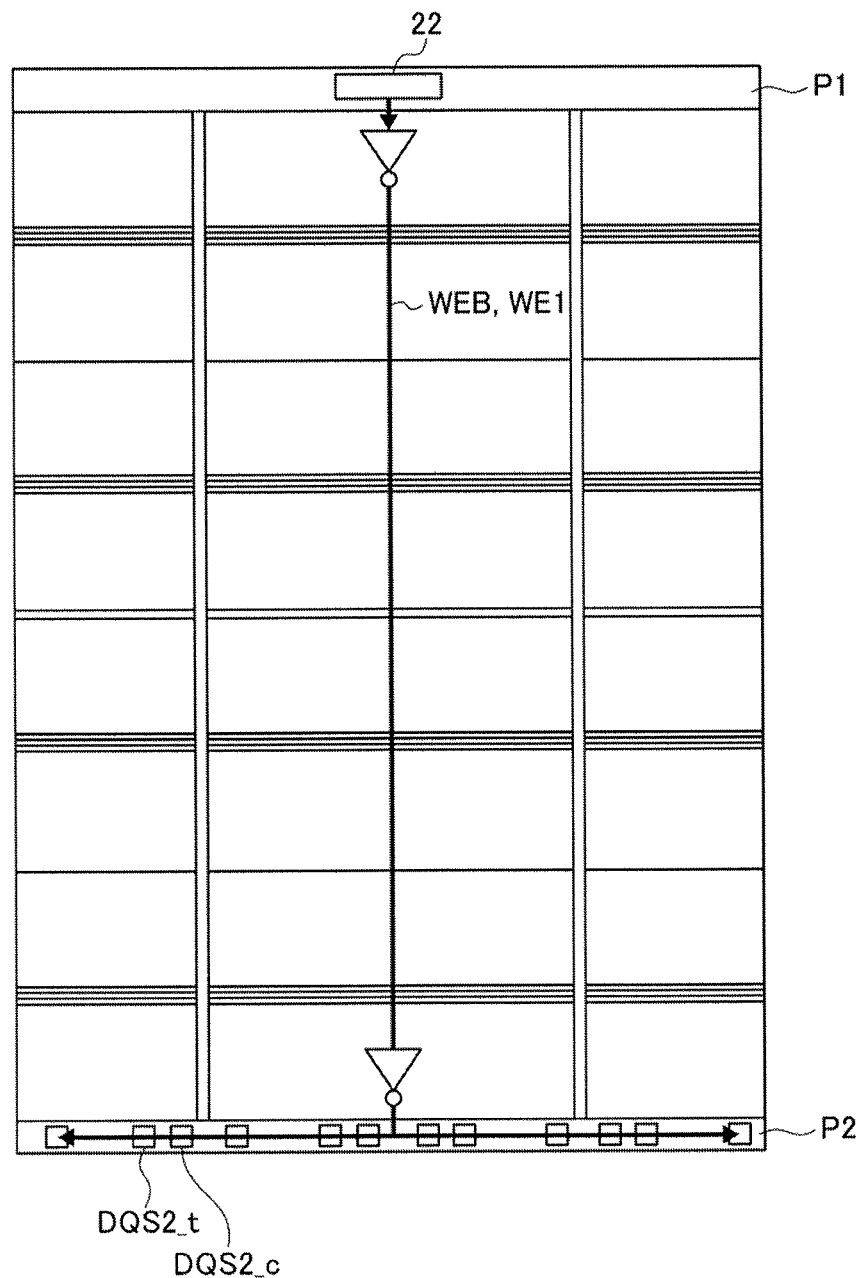
FIG. 3 is a diagram illustrating a signal path for an enable signal WEB and a timing signal WE1.

As shown in FIG. 1, the first peripheral circuit region P1 and the second peripheral circuit region P2 are disposed along side edges L1, L2 of the silicon chip CP that face each other. Therefore, a wiring distance of a signal line connecting the access control circuit 20 to the data control circuit 30 is very long. FIG. 3 is a diagram illustrating this problem, showing a signal path for an enable signal WEB and a timing signal WE1, which are output from the command decoder 22. As shown in FIG. 3, the enable signal WEB and the timing signal WE1 are supplied to the data control circuit 30 via signal lines that are so disposed as to go across the memory cell array MA. The signal lines have a relatively large parasitic capacitance. Accordingly, there is a non-negligible time difference between when the command decoder 22 generates the enable signal WEB and the timing signal WE1 and when the enable signal WEB and the timing signal WE1 reach the data control circuit 30.

Figure 4:
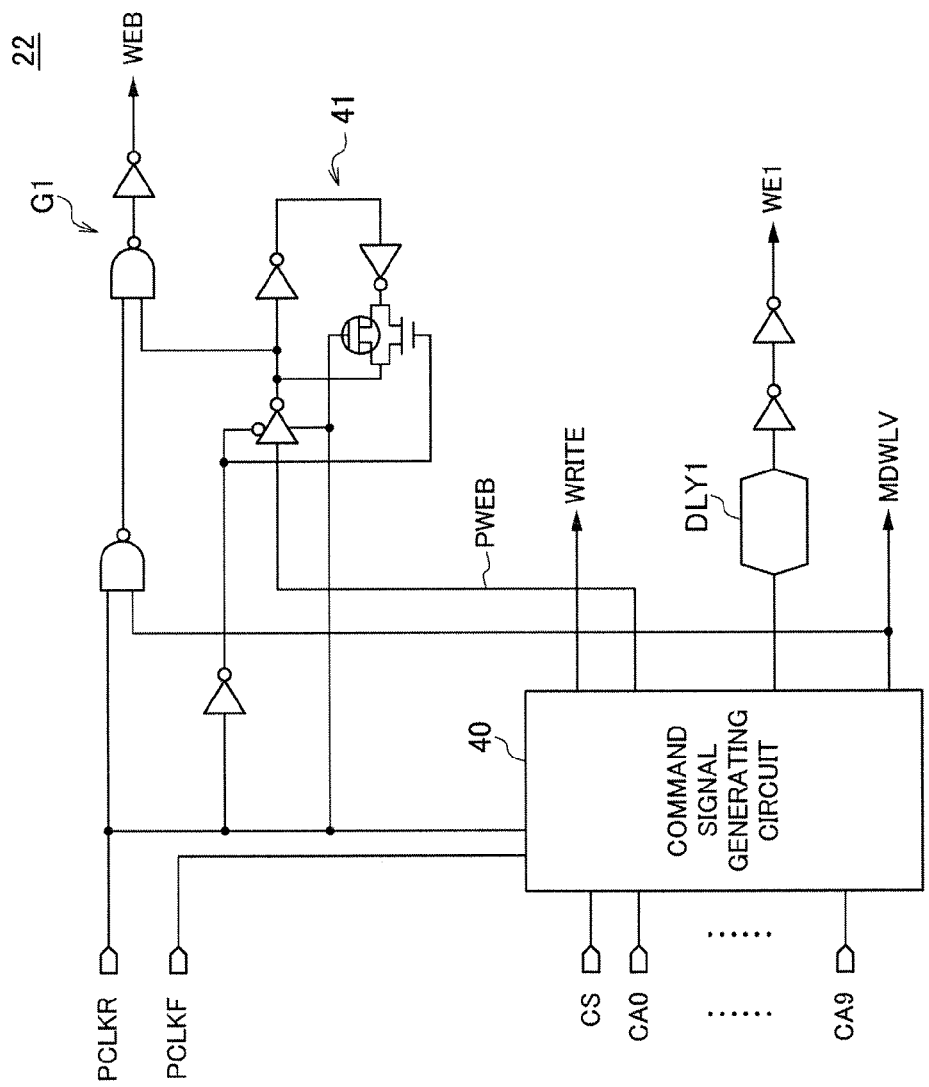
FIG. 4 is a circuit diagram showing major portions of a command decoder according to an embodiment of the invention.

FIG. 4 illustrates a command decoder 22 according to an embodiment of the invention. The command decoder 22 includes a command signal generating circuit 40 that generates various internal signals based on the chip select signal CS and the command address signals CA0 to CA9. Among the internal signals generated by the command signal generating circuit 40, FIG. 4 shows an enable signal PWEB pertaining to the writing operation, a timing signal WE1 and a write state signal WRITE, and a write leveling signal MDWLV pertaining to a write leveling operation.

Figure 5:
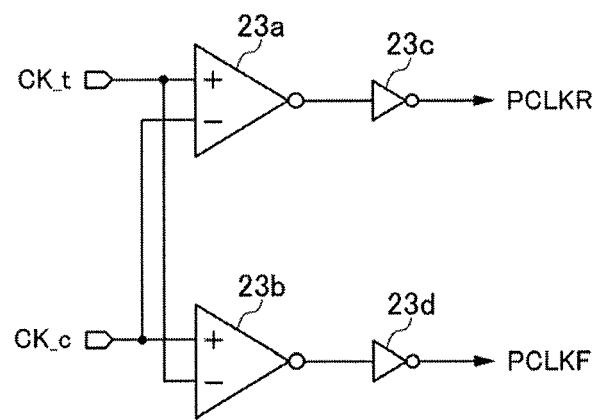
FIG. 5 is a circuit diagram showing a clock generating circuit according to an embodiment of the invention.

The operation of the command signal generating circuit 40 is performed in synchronization with internal clock signals PCLKR and PCLKF. The internal clock signals PCLKR and PCLKF are generated by the clock generating circuit 23 shown in FIG. 2. FIG. 5 illustrates a clock generating circuit 23 according to an embodiment of the invention. As shown in FIG. 5, the clock generating circuit 23 includes a pair of receiver circuits 23a and 23b which receive complementary external clock signals CK_t and CK_c, and inverter circuits 23c and 23d which receive output signals of the receiver circuits 23a and 23b. The output signals of the inverter circuits 23c and 23d are used as the internal clock signals PCLKR and PCLKF, respectively. The external clock signal CK_t is supplied to a non-inverting input node (+) of the receiver circuit 23a, and the external clock signal CK_c is supplied to an inverting input node (−) of the receiver circuit 23a. The external clock signal CK_c is supplied to a non-inverting input node (+) of the receiver circuit 23b, and the external clock signal CK_t is supplied to an inverting input node (−) of the receiver circuit 23b. Therefore, the waveform of the internal clock signal PCLKR is substantially identical to the waveform of the external clock signal CK_t. The waveform of the internal clock signal PCLKF is substantially identical to the waveform of the external clock signal CK_c.

Figure 14:
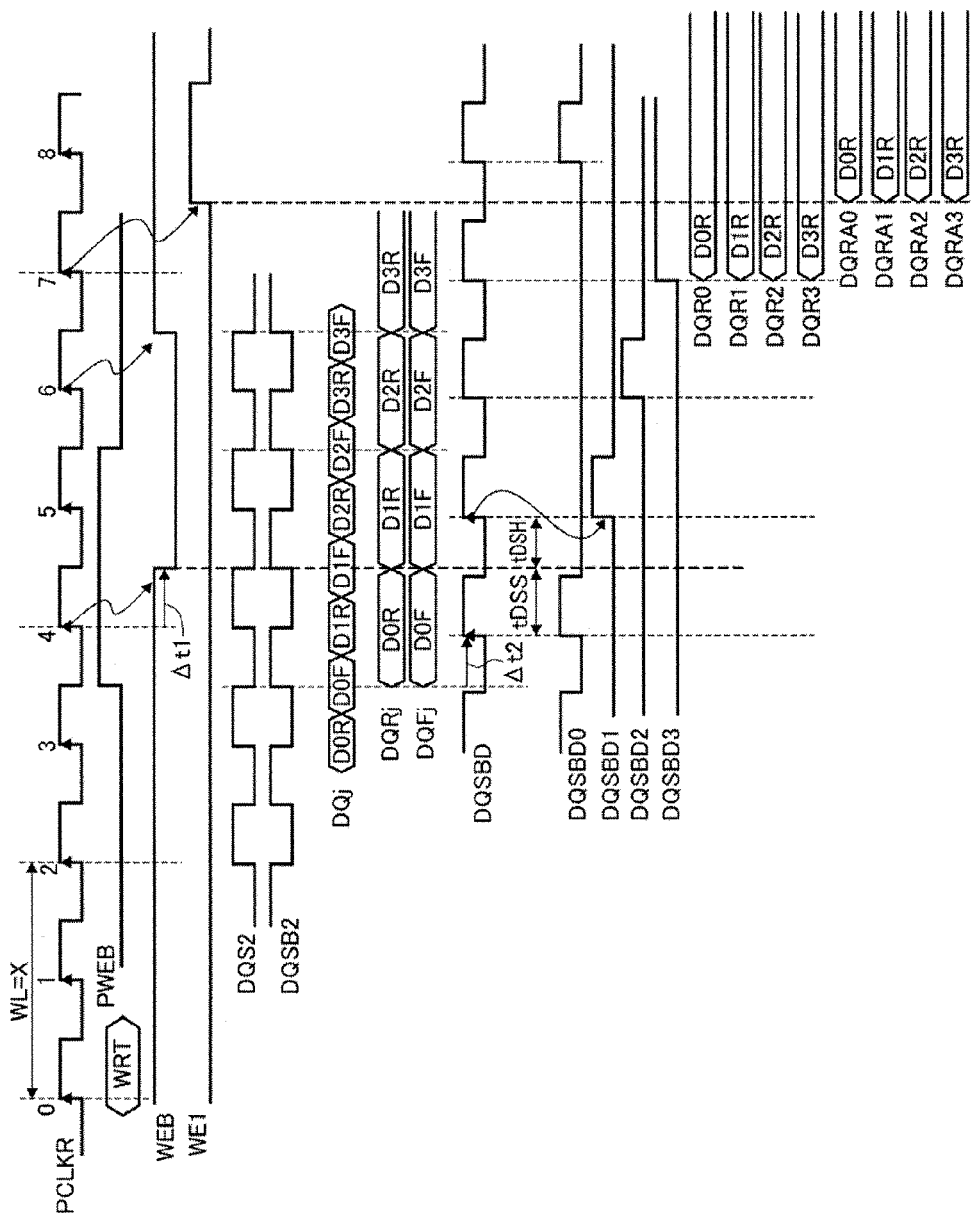
FIG. 14 is an operation waveform diagram for explaining the operation of the semiconductor device according to an embodiment, showing a case when a write command WRT is issued once.

After a write command is issued, the command signal generating circuit 40 activates the write state signal WRITE to a high level, and, after a predetermined period of time has passed, the command signal generating circuit 40 changes the enable signal PWEB to a high level. According to the present embodiment, as shown in FIG. 14, if the write command WRT is issued in synchronization with an edge 0 of the internal clock signal PCLKR, the enable signal PWEB is activated to a high level during a period of time extending from next falling edge of an edge 3 of the internal clock signal PCLKR to next falling edge of an edge 5. As shown in FIG. 4, the enable signal PWEB is supplied to a latch circuit 41. The latch circuit 41 performs a latch operation in synchronization with a rising edge of the internal clock signal PCLKR. An output signal of the latch circuit 41 is supplied to one of the input nodes of a gate circuit G1. The other input node of the gate circuit G1 is fixed to a high level except during the write leveling operation. Therefore, during a period of time when the enable signal PWEB is inactivated to a low level, the enable signal WEB is fixed to a high level.

After the enable signal PWEB is activated to a high level, the enable signal WEB is changed to a low level in synchronization with a rising edge of the internal clock signal PCLKR. According to the present embodiment, as shown in FIG. 14, during a period of time from an edge 4 of the internal clock signal PCLKR to an edge 6, the enable signal WEB is changed to a low level. Incidentally, the waveform of the enable signal WEB shown in FIG. 14 is the waveform in the second peripheral circuit region P2. Since the signal is transmitted through the long signal line, there is a delay of Δt1 relative to the waveform in the first peripheral circuit region P1.

After the write command is issued, the command signal generating circuit 40 activates the timing signal WE1 at a predetermined timing. According to the present embodiment, as shown in FIG. 14, the timing signal WE1 is activated in synchronization with an edge 7 of the internal clock signal PCLKR. A delay circuit DLY1 is inserted into a signal path of the timing signal WE1. Therefore, the activation timing of the timing signal WE1 is slightly delayed relative to the edge 7 of the internal clock signal PCLKR. This configuration is intended to adjust the timing of a transfer operation in transfer circuit 100R and 100F, which will be described later.

Figure 6:
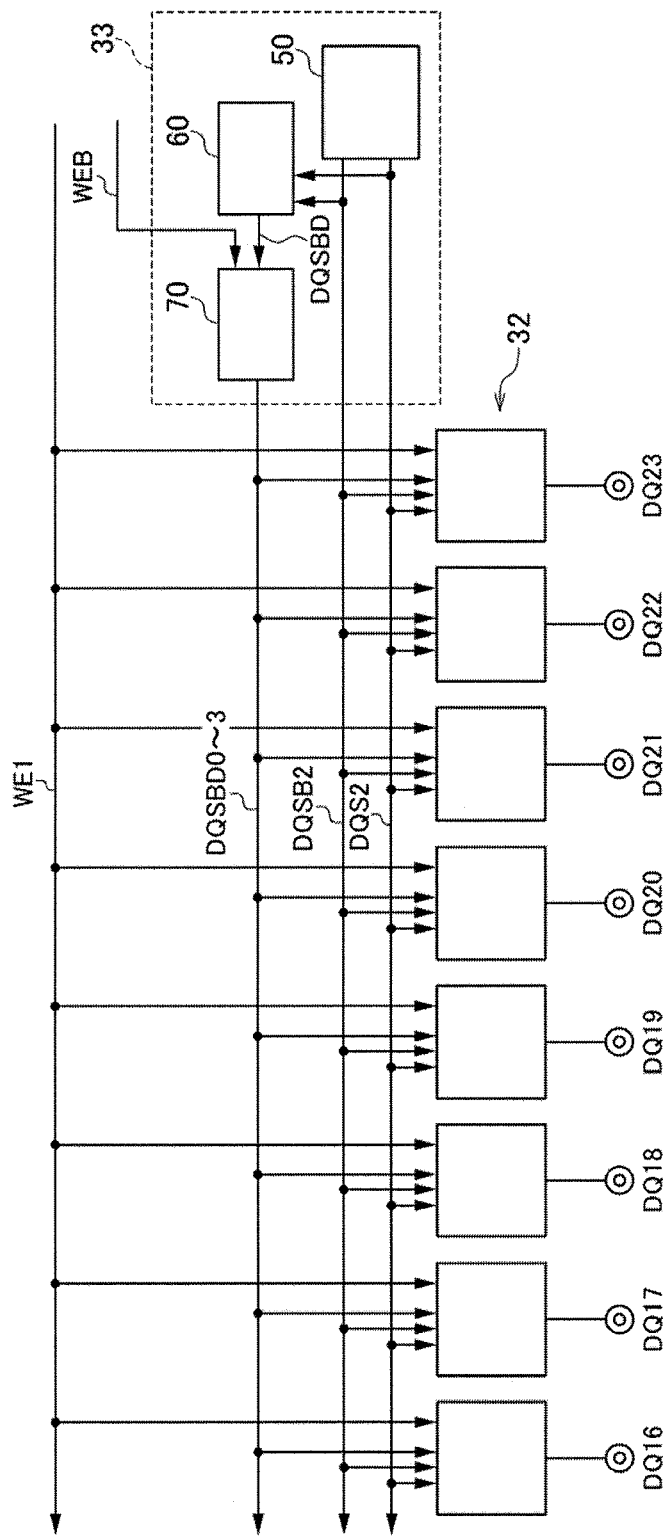
FIG. 6 is a block diagram showing a part of a data input circuit and a part of a strobe control circuit according to an embodiment of the invention.

FIG. 6 is a block diagram showing a portion of the data input circuit 32 and a portion of the strobe control circuit 33 according to an embodiment of the invention. FIG. 6 shows a portion of the data input circuit 32 that corresponds to the data terminals DQ16 to DQ23, and a portion of the strobe control circuit 33 that corresponds to the strobe signals DQS2t and DQS2c.

As shown in FIG. 6, the timing signal WE1, the strobe signals DQS2, DQSB2, and DQSBD0 to DQSBD3 are supplied to the data input circuit 32 corresponding to the data terminals DQ16 to DQ23. The strobe signals DQS2, DQSB2, and DQSBD0 to DQSBD3 are generated by the strobe control circuit 33. As shown in FIG. 6, the strobe control circuit 33 includes a strobe input circuit 50 and control signal generating circuits 60 and 70. The enable signal WEB is supplied to the strobe control circuit 33 via the long signal line.

First, the circuit configuration of each of circuits constituting the strobe control circuit 33 will be described.

Figure 7:
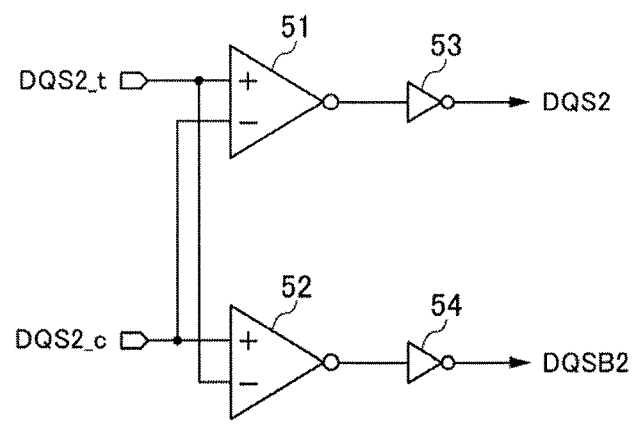
FIG. 7 is a circuit diagram of a strobe input circuit according to an embodiment of the invention.

FIG. 7 illustrates a strobe input circuit 50 according to an embodiment of the invention. As shown in FIG. 7, the strobe input circuit 50 has a circuit configuration similar to that of the clock generating circuit 23 shown in FIG. 5. That is, the strobe input circuit 50 includes a pair of receiver circuits 51 and 52 which receive data strobe signals DQS2_t and DQS2_c, and inverter circuits 53 and 54 which receive outputs of the receiver circuits 51 and 52. The output signals of the inverter circuits 53 and 54 are used as the strobe signals DQS2 and DQSB2, respectively. The strobe signal DQS2_t is supplied to a non-inverting input node (+) of the receiver circuit 51, and the strobe signal DQS2_c is supplied to an inverting input node (−) of the receiver circuit 51. The strobe signal DQS2_c is supplied to a non-inverting input node (+) of the receiver circuit 52, and the strobe signal DQS2_t is supplied to an inverting input node (−) of the receiver circuit 52. Therefore, the waveform of the strobe signal DQS2 is substantially identical to the waveform of the strobe signal DQS2_t. The waveform of the strobe signal DQSB2 is substantially identical to the waveform of the strobe signal DQS2_c. Thus, the strobe signals DQS2 and DQSB2 can be considered the same as the strobe signals DQS2_t and DQS2_c. Incidentally, the strobe signals DQS2_t and DQS2_c are assigned to the data terminals DQ16 to DQ23.

Figure 8:
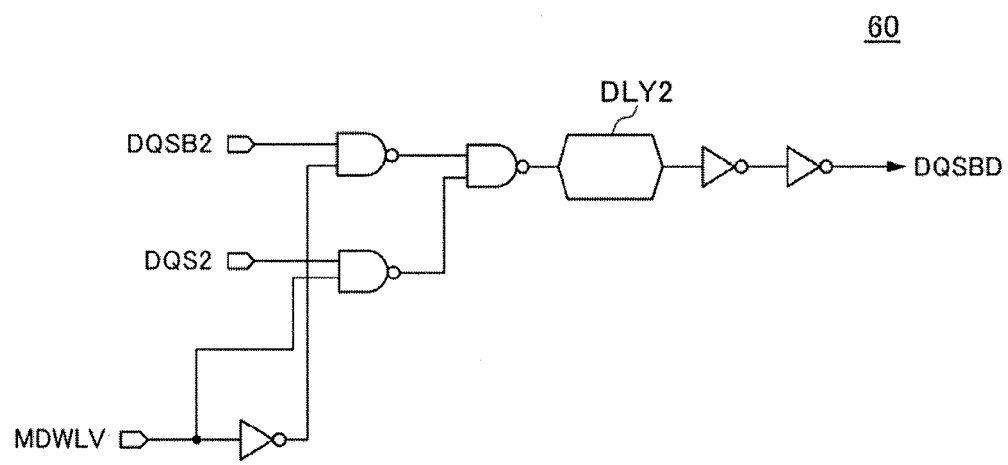
FIG. 8 is a circuit diagram of a control signal generating circuit according to an embodiment of the invention.

FIG. 8 illustrates a control signal generating circuit 60 according to an embodiment of the invention. As shown in FIG. 8, the control signal generating circuit 60 is a circuit in which either the strobe signal DQS2 or DQSB2 is delayed by a delay circuit DLY2 and is output as a strobe signal DQSBD. During a normal operation except a write leveling operation, the strobe signal DQSB2 is selected, and is delayed to generate the strobe signal DQSBD. During the write leveling operation, because a write leveling signal MDWLV is at a high level, the strobe signal DQS2 is selected. An amount of delay by the delay circuit DLY2 is Δt2. Accordingly, as shown in FIG. 14, the waveform of the strobe signal DQSBD is delayed by Δt2 relative to the strobe signal DQSB2. The amount of delay Δt2 by the delay circuit DLY2 is designed based on the transmission delay amount Δt1 of the enable signal WEB.

Figure 9:
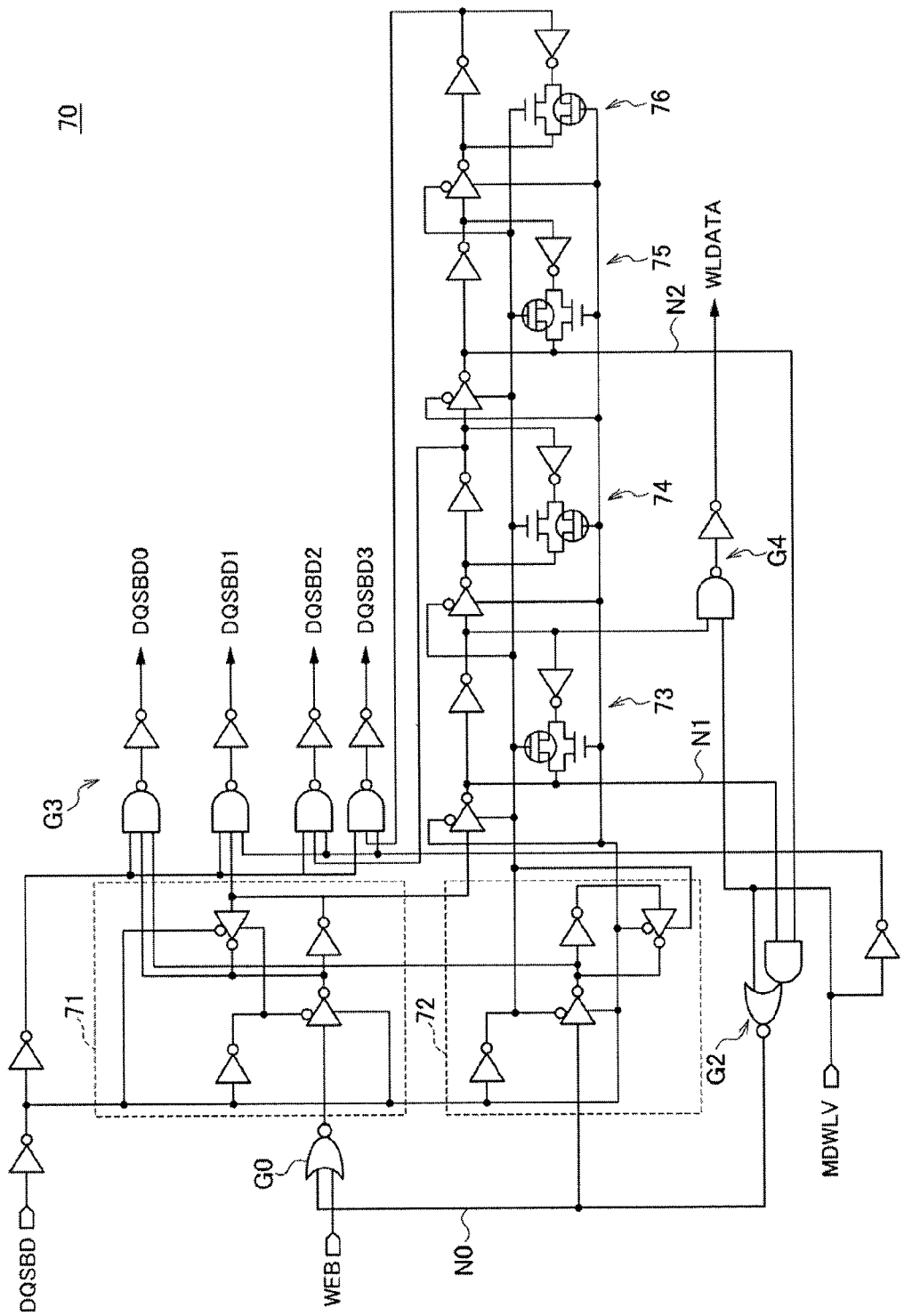
FIG. 9 is a circuit diagram of another control signal generating circuit according to an embodiment of the invention.

The control signal generating circuit 70 receives the strobe signal DQSBD and the enable signal WEB to generate strobe signals DQSBD0 to DQSBD3. FIG. 9 illustrates control signal generating circuit 70 according to an embodiment of the invention. As shown in FIG. 9, the control signal generating circuit 70 includes a plurality of latch circuits 71 to 76. Each of the latch circuits 71 to 76 performs a latch operation in synchronization with the strobe signal DQSBD. After the enable signal WEB is changed to a low level, an output signal of a gate circuit G0 is sequentially transferred to the latch circuits 71, 73, 74, 75, and 76 in that order. An output signal N1 of the latch circuit 73 and an output signal N2 of the latch circuit 75 are fed back to the latch circuit 71 as an output signal N0 via the gate circuit G2, and are latched by the latch circuit 72. The wiring shown in FIG. 9 allows latch data of each of the latch circuits 71 to 76 to be supplied to a gate circuit G3. As a result, the strobe signals DQSBD0 to DQSBD3 are generated. The specific operation will be described with reference to FIG. 14.

During the write leveling operation, the strobe signals DQSBD1 to DQSBD3 are fixed to a low level, and latch data of the latch circuit 73 is output through a gate circuit G4 as write leveling data WLDATA.

The above has described the circuit configuration of the strobe control circuit 33. The following describes the circuit configuration of the data input circuit 32.

Figure 10:
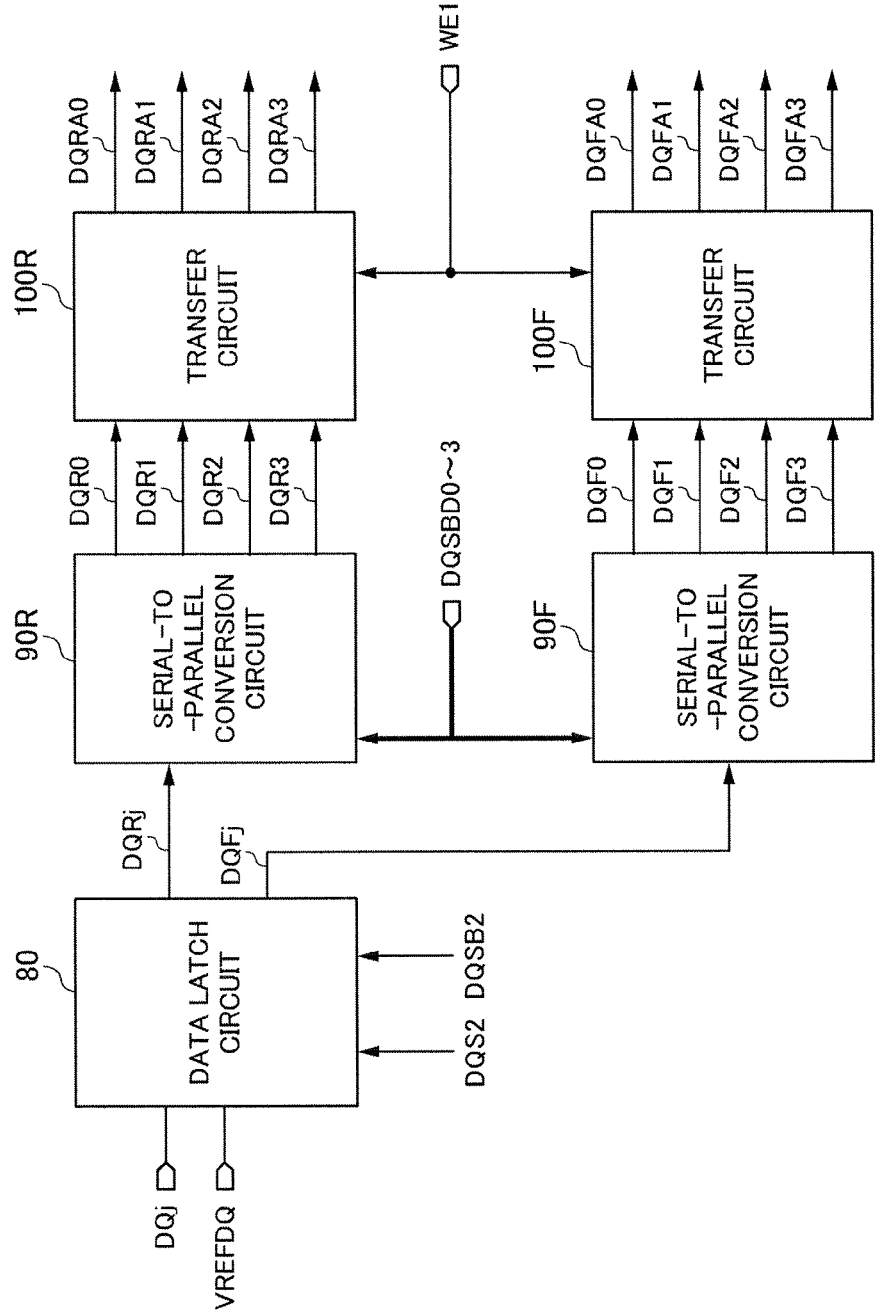
FIG. 10 is a circuit diagram of a data input circuit according to an embodiment of the invention.

FIG. 10 is a circuit diagram of the data input circuit 32 according to an embodiment of the invention, showing one data input circuit 32 corresponding to the data terminals DQ16 to DQ23.

As shown in FIG. 10, the data input circuit 32 includes a data latch circuit 80, serial-to-parallel conversion circuits 90R and 90F, and transfer circuits 100R and 100F. The data latch circuit 80 latches write data DQj (j=16 to 23) in synchronization with the strobe signals DQS2 and DQSB2. Write data DQRj that is latched in synchronization with a rising edge of the strobe signal DQS2 is transferred to the serial-to-parallel conversion circuit 90R. Write data DQFj that is latched in synchronization with a rising edge of the strobe signal DQSB2 (or a falling edge of the strobe signal DQS2) is transferred to the serial-to-parallel conversion circuit 90F.

The serial-to-parallel conversion circuits 90R and 90F convert the serial write data DQRj and DQFj into parallel write data DQR0 to DQRS and DQF0 to DQF3, and transfer the parallel write data DQR0 to DQRS and DQF0 to DQF3 to the transfer circuits 100R and 100F. In synchronization with the timing signal WE1, the transfer circuits 100R and 100F output the write data DQRA0 to DQRA3 and DQFA0 to DQFA3 to the memory cell array MA. Incidentally the serial-to-parallel conversion circuits 90R and 90F have the same circuit configuration. The transfer circuits 100R and 100F have the same circuit configuration.

Figure 11:
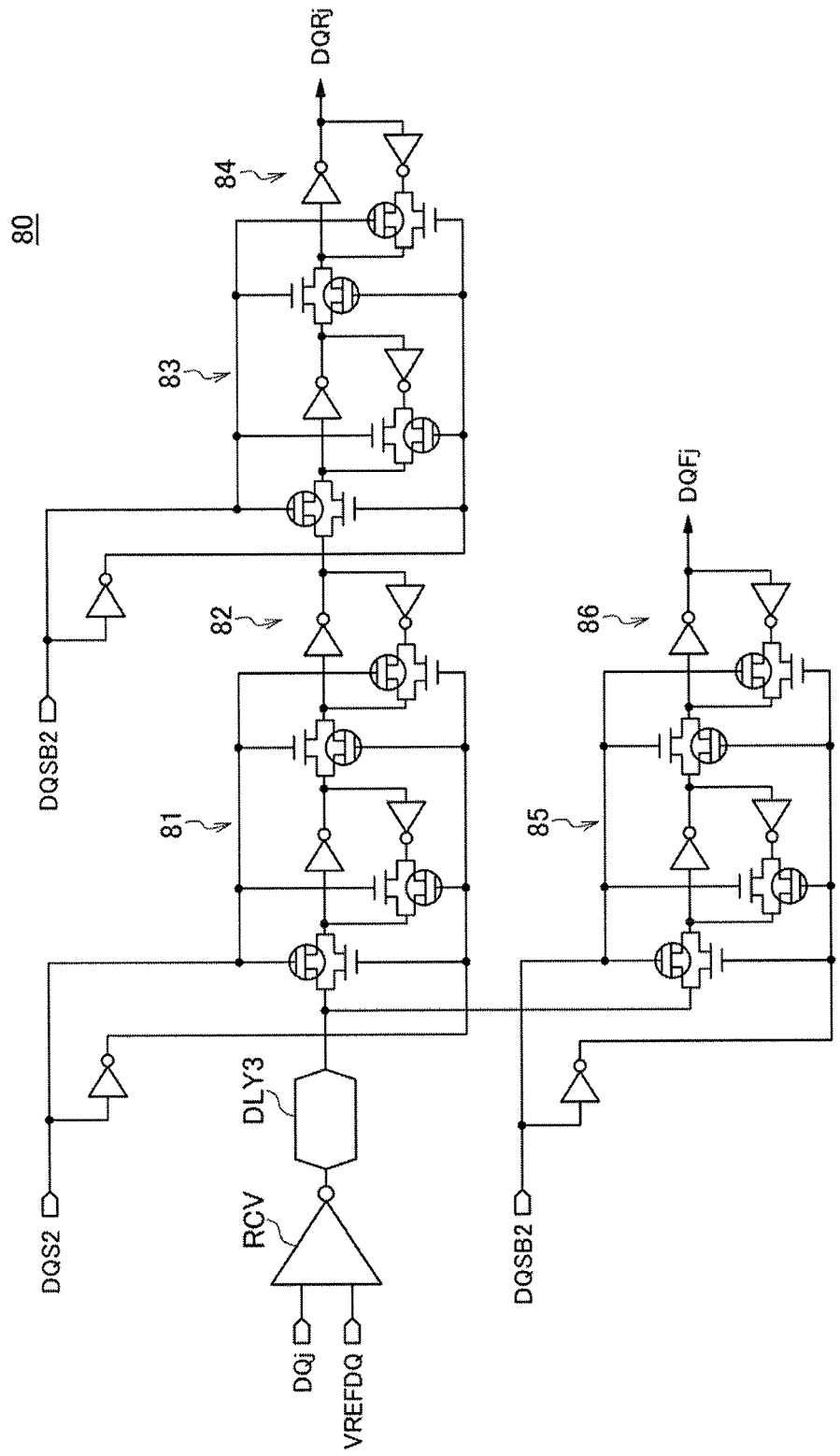
FIG. 11 is a circuit diagram of a data latch circuit according to an embodiment of the invention.

FIG. 11 illustrates data latch circuit 80 according to an embodiment of the invention. The data latch circuit 80 includes latch circuits 81 to 86 that transfer write data DQj, which are input in a serial manner via an input receiver RCV and a delay circuit DLY3. The input receiver RCV is a differential circuit that operates based on a difference in potential between the write data DQj and reference potential VREFDQ. An output signal of the input receiver RCV is supplied via the timing-adjusting delay circuit DLY3 to the latch circuits 81 to 84 connected in series and to the latch circuits 85 and 86 connected in series.

The latch circuit 81 captures an input signal during a period of time in which the strobe signal DQS2 is at a low level, and keeps the captured input signal during a period of time in which the strobe signal DQS2 is at a high level. The latch circuit 82 captures an input signal during a period of time in which the strobe signal DQS2 is at a high level, and keeps the captured input signal during a period of time in which the strobe signal DQS2 is at a low level. The latch circuits 83 and 85 capture an input signal during a period of time in which the strobe signal DQSB2 is at a low level, and keep the captured input signal during a period of time in which the strobe signal DQSB2 is at a high level. The latch circuits 84 and 86 capture an input signal during a period of time in which the strobe signal DQSB2 is at a high level, and keep the captured input signal during a period of time in which the strobe signal DQSB2 is at a low level. The write data DQRj and DQFj are respectively taken out from the latch circuits 84 and 86.

According to the above configuration, among the write data DQj that are input in a serial manner, those latched in synchronization with a rising edge of the strobe signal DQS2 are output as write data DQRj; and those latched in synchronization with a rising edge of the strobe signal DQSB2 are output as write data DQFj. Accordingly, the write data DQj having a data effective width of 0.5 clock cycle are converted into the write data DQRj and DQFj with a data effective width of 1 clock cycle. The write data DQRj and DQFj are supplied to the serial-to-parallel conversion circuits 90R and 90F shown in FIG. 10.

Figure 12:
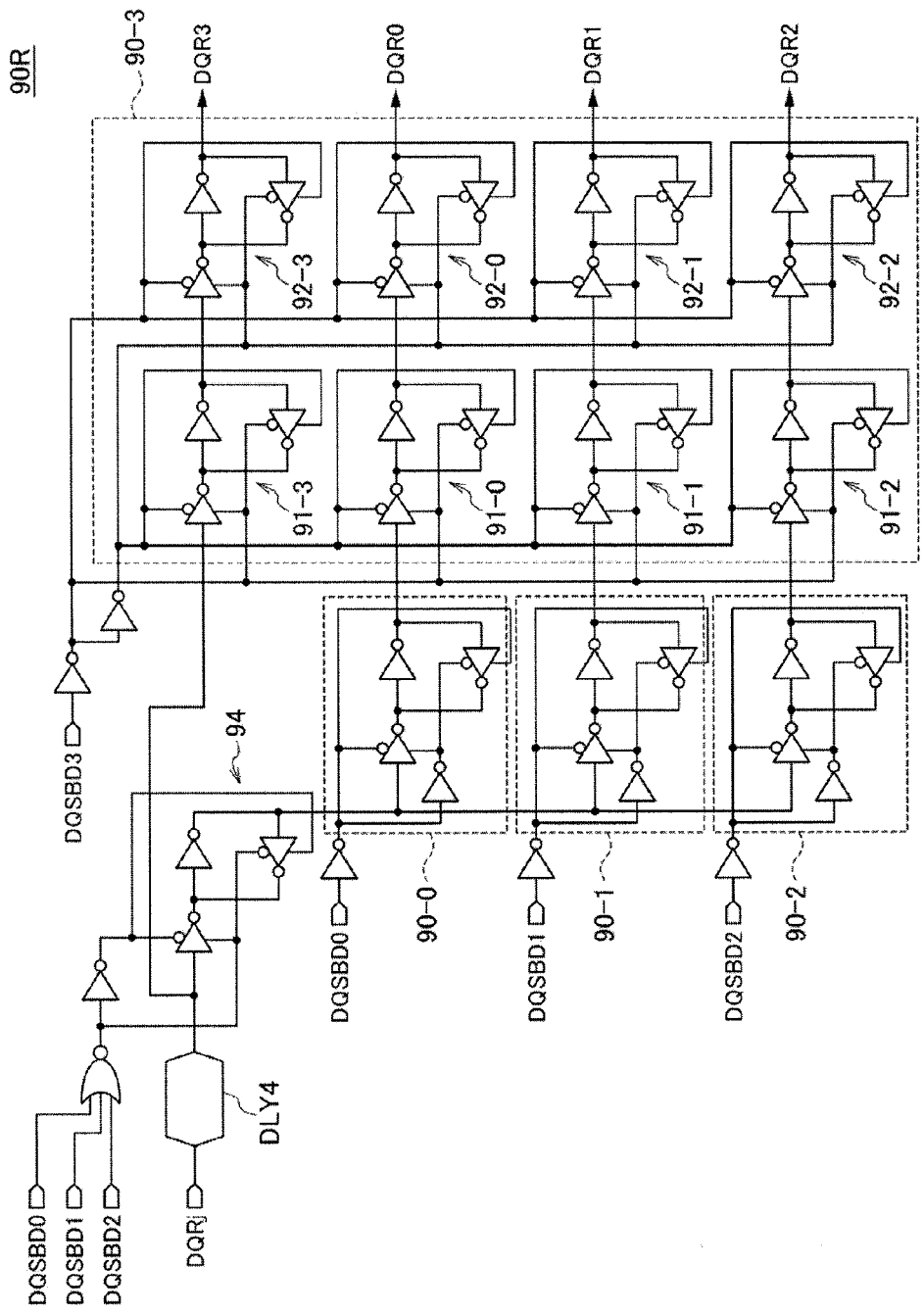
FIG. 12 is a circuit diagram of a serial-to-parallel conversion circuit according to an embodiment of the invention.

FIG. 12 illustrates a serial-to-parallel conversion circuit 90R according to an embodiment of the invention. The serial-to-parallel conversion circuit 90R includes a delay circuit DLY4 which delays the write data DQRj, and latch circuits 90-0 to 90-3 each of which performs a latch operation in synchronization with the strobe signals DQSBD0 to DQSBD3. Furthermore, the serial-to-parallel conversion circuit 90R includes a latch circuit 94 which latches an output signal of the delay circuit DLY4 in synchronization with one of the strobe signals DQSBD0 to DQSBD2. An output signal of the latch circuit 94 is supplied in common to the latch circuits 90-0 to 90-2. The write data DQRj which do not pass through the latch circuit 94, and output signals of the latch circuits 90-0 to 90-2 are supplied to the latch circuit 90-3 in a parallel manner.

The latch circuit 90-3 includes first-stage latch circuits 91-0 to 91-3 and second-stage latch circuits 92-0 to 92-3. The output signals of the latch circuits 90-0 to 90-2 are respectively supplied to the latch circuits 91-0 to 91-2. The write data DQRj that does not pass through the latch circuit 94 is supplied to the latch circuit 91-3. Moreover, the output signals of the latch circuits 91-0 to 91-3 are supplied to the latch circuits 93-0 to 93-3.

According to the above configuration, the write data DQRj that are input in a serial manner are sequentially latched by the different latch circuits in synchronization with the strobe signals DQSBD0 to DQSBD3, and are output as parallel write data DQR0 to DQR3. In this manner, the write data DQRj having a data effective width of one clock cycle are converted into parallel write data DQR0 to DQR3 having a data effective width of four clock cycles. The write data DQR0 to DQR3 are supplied to the transfer circuit 100R shown in FIG. 10.

Figure 13:
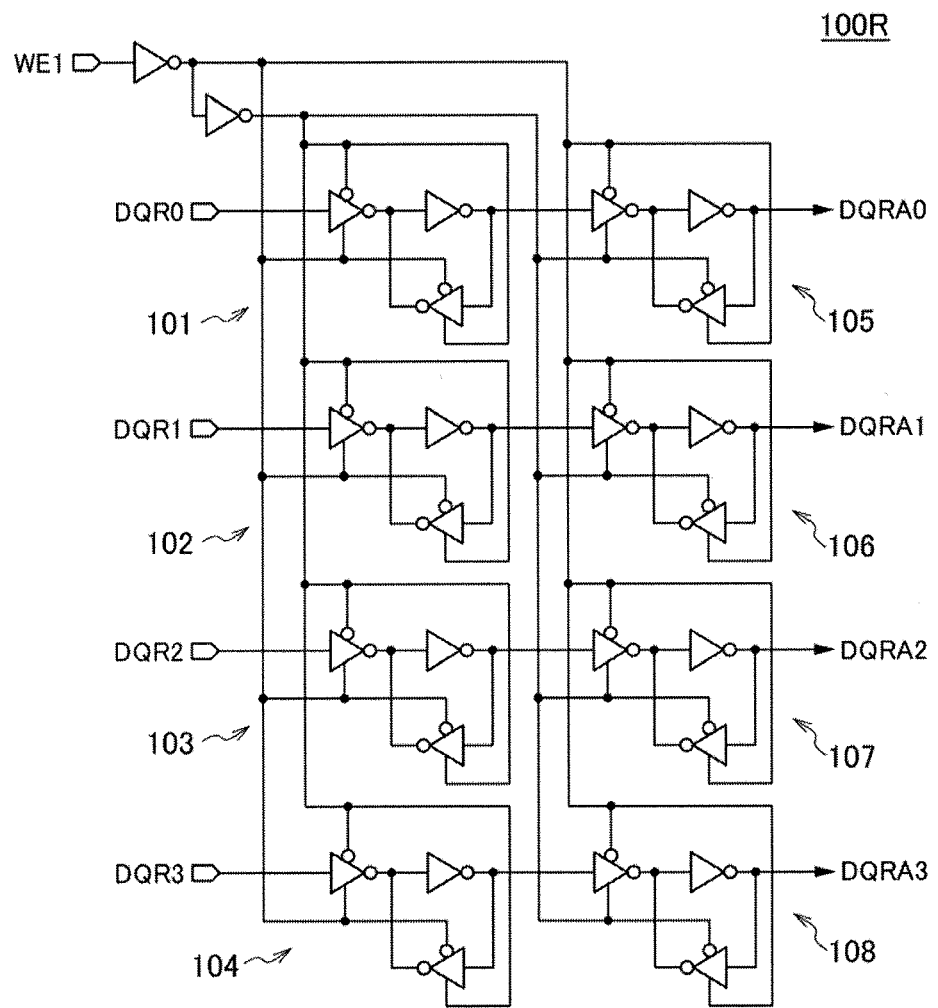
FIG. 13 is a circuit diagram of a transfer circuit according to an embodiment of the invention.

FIG. 13 illustrates a transfer circuit 100R according to an embodiment of the invention. The transfer circuit 100R includes latch circuits 101 to 104 which perform a latch operation when the timing signal WE1 is at a low level, and latch circuits 105 to 108 which perform a latch operation when the timing signal WE1 is at a high level. The latch circuits 101 and 105 are connected in series, and capture the write data DQR0 to output as write data DQRA0. Similarly, the latch circuits 102 and 106, 103 and 107, and 104 and 108 are connected in series, and capture the write data DQR1 to DQR3 to output as write data DQRA1 to DQRA3. According to this configuration, the parallel write data DQR0 to DQR3 are output as write data DQRA0 to DQRA3 in synchronization with a rising edge of the timing signal WE1, and the write data DQRA0 to DQRA3 are transferred to the memory cell array MA. As a result, an actual writing operation for the memory cell array MA will be performed.

The above has described the circuit configuration of the semiconductor device 10 according to the present embodiment. The following describes operation of the semiconductor device 10 according to the present embodiment.

In the example shown in FIG. 14, the write command WRT is issued in synchronization with an edge 0 of the clock signal PCLKR. After two clock cycles have passed, a clocking of the strobe signals DQS2 and DQSB2 starts. After a one-clock-cycle preamble period has passed, a burst inputting of the write data DQj starts. Accordingly, the data latch circuit 80 shown in FIG. 11 separates the write data DQj into rise-side write data DQRj and fall-side write data DQFj. During this operation, the write data DQj having a data effective width of 0.5 clock cycle are converted into the write data DQRj and DQFj having a data effective width of 1 clock cycle.

In response to the clocking of the strobe signal DQSB2, the control signal generating circuit 60 shown in FIG. 8 generates the strobe signal DQSBD whose phase is delayed by the amount Δt2 relative to the strobe signal DQSB2. The control signal generating circuit 60 supplies the strobe signal DQSBD to the control signal generating circuit 70.

The command decoder 22 shown in FIG. 4 changes, in synchronization with an edge 4 of the clock signal PCLKR, the enable signal WEB to a low level. The change in the enable signal WEB is conveyed to the control signal generating circuit 70 via the long-distance wire that goes across the memory cell array MA. Therefore, the transmission delay time t1 is required for the change to be conveyed to the control signal generating circuit 70 after the command decoder 22 has changed the enable signal WEB to a low level.

After the enable signal WEB is changed to a low level, the clocking of the strobe signal DQSBD0 is stopped. The strobe signals DQSBD1, DQSBD2, and DQSBD3 become activated in that order at intervals of one clock cycle. In this manner, the serial write data DQRj having a data effective width of one clock cycle are converted by the serial-to-parallel conversion circuit 90R into a parallel format or 4-bit-width parallel write data DQR0 to DQR3. Although not shown in FIG. 14, the write data DQFj are converted by the serial-to-parallel conversion circuit 90F into a parallel format or 4-bit-width parallel write data DQF0 to DQF3.

After that, the parallel write data DQR0 to DQR3 are transferred from the transfer circuit 100 R to the memory cell array MA in response to the activation of the timing signal WE1. Although not shown in FIG. 14, the parallel write data DQF0 to DQF3 are transferred by the transfer circuit 100F to the memory cell array MA in response to the activation of the timing signal WE1. In that manner, the eight-bit write data DQj that are supplied from the outside in a serial manner are written into a memory cell specified by the address signal in a parallel manner.

In the above-described writing operation, the clocking is performed just once for the enable signal WEB that should be supplied from the command decoder 22 to the data input circuit 32 via the long signal line. Therefore, an amount of current consumed by a change in the enable signal WEB can be significantly reduced. Moreover, the timing at which the enable signal WEB is changed to a low level may satisfy a standard value of setup time tDSS and a standard value of hold time tDSH as shown in FIG. 14. According to the present embodiment, if the delay time Δt2 is appropriately designed with respect to the transmission delay time Δt1, it is possible to accurately adjust the setup time tDSS and the hold time tDSH. Thus, even if the frequency of the clock signal is high, the standard values can be satisfied.

Figure 15:
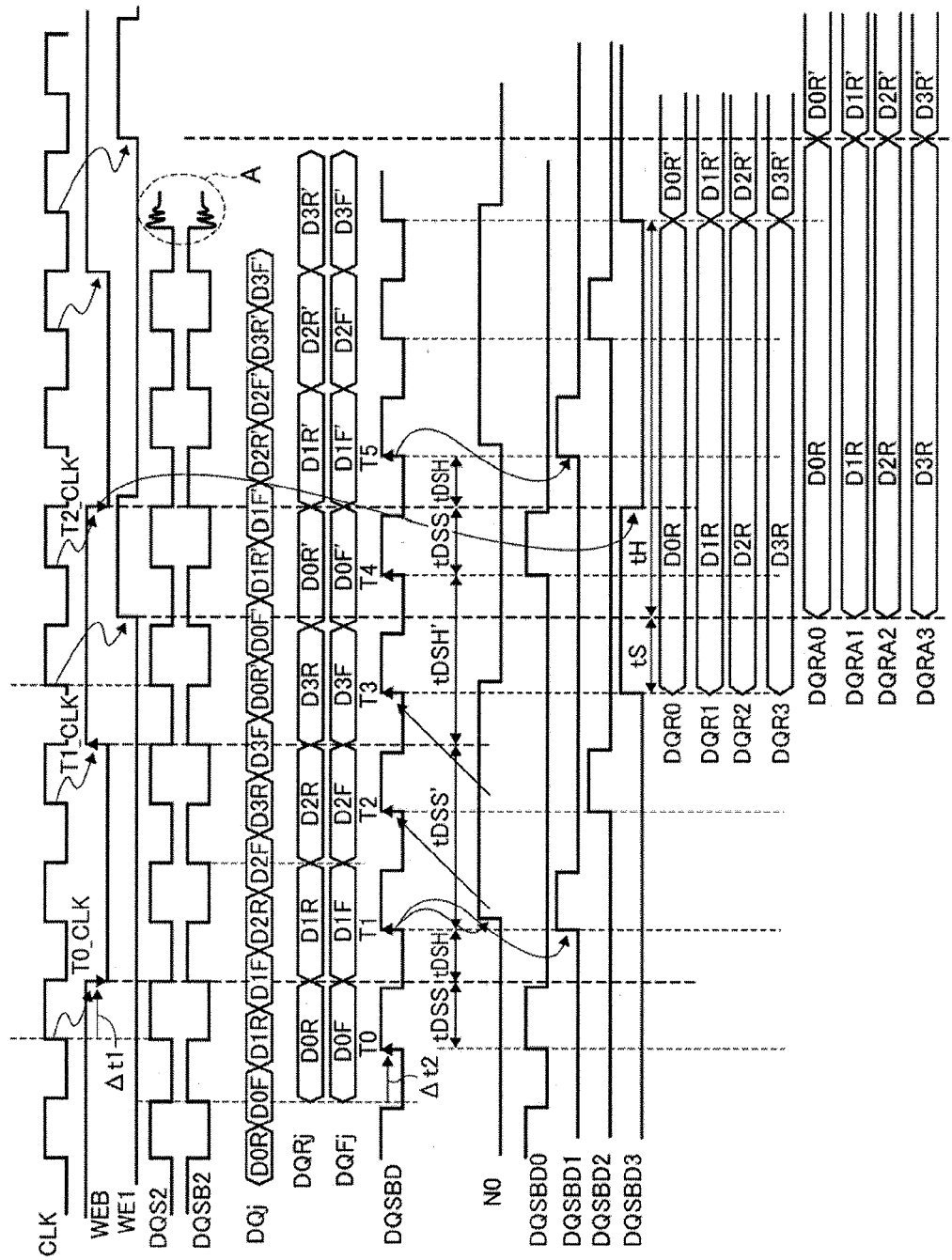
FIG. 15 is an operation waveform diagram for explaining the operation of the semiconductor device according to an embodiment, showing a case when two write commands WRT are successively issued.

If the write commands are successively issued, as shown in FIG. 15, the above-described operation is repeatedly performed. FIG. 15 also shows the waveform of the output signal N0 shown in FIG. 9. As shown in FIG. 15, at the timing when edges T2 and T3 of the strobe signal DQSBD occur, the output signal N0 is at a high level. Therefore, during this period, the timing of the enable signal WEB does not make any sense. The timing of the enable signal WEB makes sense during a period of time in which the output signal N0 is at a low level. The above-described setup time tDSS and hold time tDSH are determined based on the timing of the enable signal WEB and strobe signal DQSBD during this period.

The characteristics are actually affected by a time difference between the timing at which the changing of the enable signal WEB to a low level reaches the data input circuit and a rising edge of the strobe signal DQSBD. More specifically, based on a period of time from when the edge T0 (T4) of the strobe signal DQSBD emerges to when the enable signal WEB is changed to a low level, the setup time tDSS is defined. Based on a period of time from when the enable signal WEB is changed to a low level to when the edge T1 (T5) of the strobe signal DQSBD emerges, the hold time tDSH is defined. Meanwhile, a period of time from when the edge T1 of the strobe signal DQSBD emerges to when the enable signal WEB is changed to a high level is defined as setup time tDSS', a period of time from when the enable signal WEB is changed to a high level to when the edge T4 of the strobe signal DQSBD emerges is defined as hold time tDSH'. As shown in FIG. 15, sufficient margins are given to those periods as shown in FIG. 15. As described above, it is unnecessary to care about the relationship between the edges T2 and T3 of the strobe signal DQSBD and the enable signal WEB.

Figure 16:
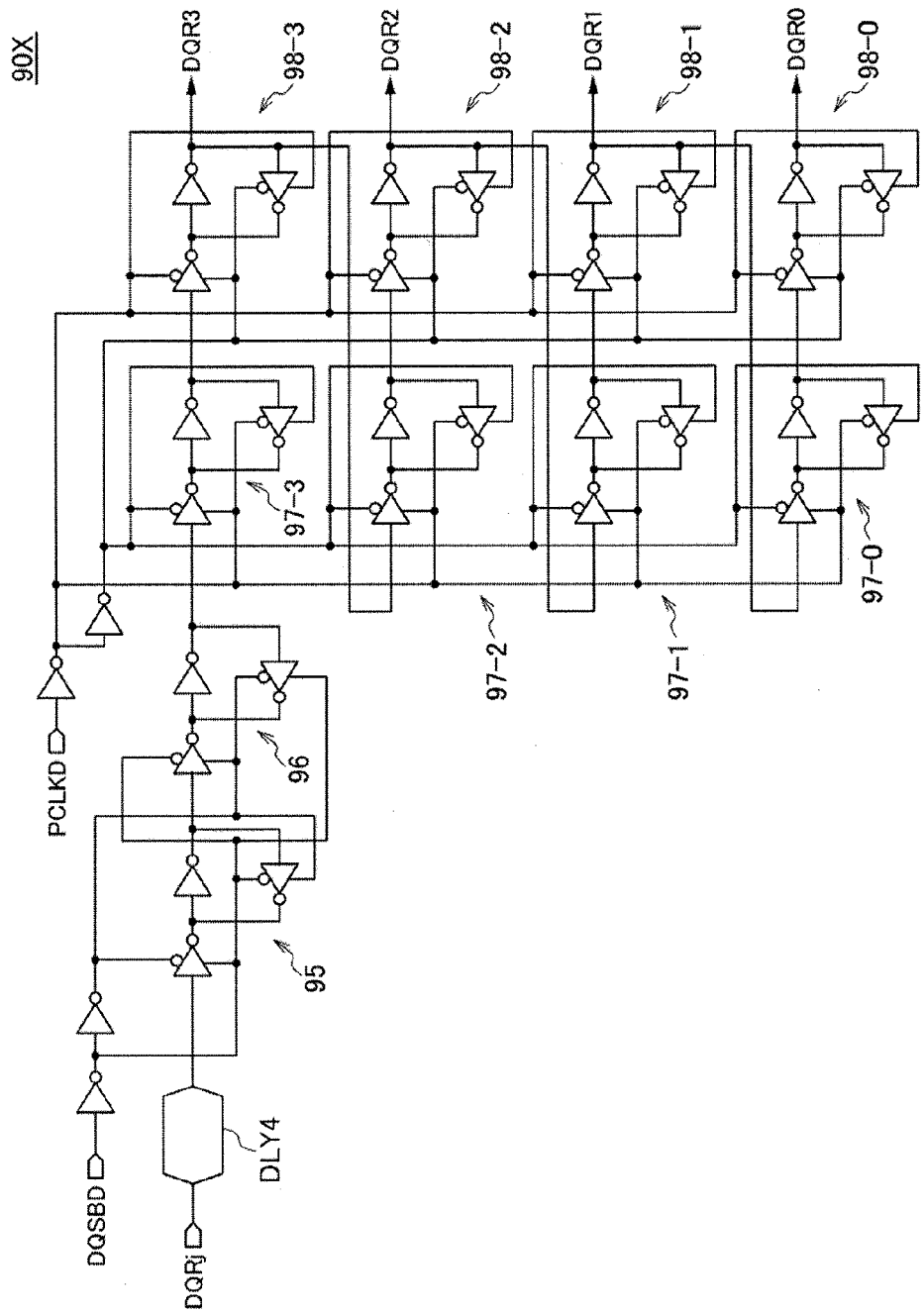
FIG. 16 is a circuit diagram of a prototype of a serial-to-parallel conversion circuit according to an embodiment of the invention.

An embodiment of the serial-to-parallel conversion circuit 90X shown in FIG. 16 includes a delay circuit DLY4 which delays write data DQRj, and latch circuits 95, 96, 97-0 to 97-3, and 98-0 to 98-3. The latch circuit 95 performs a latch operation when the strobe signal DQSBD is at a low level. The latch circuit 96 performs a latch operation when the strobe signal DQSBD is at a high level. Accordingly, the delayed write data DQRj is captured in synchronization with a rising edge of the strobe signal DQSBD.

The write data DQRj that are output from the latch circuit 96 are supplied to the eight latch circuits 97-0 to 97-3 and 98-0 to 98-3 which are connected in cascade. The latch circuits 97-0 to 97-3 and 98-0 to 98-3 are circuits that operate in synchronization with the clock signal PCLKD supplied from the command decoder 22. The latch circuits 97-0 to 97-3 perform a latch operation when the clock signal PCLKD is at a low level. The latch circuits 98-0 to 98-3 perform a latch operation when the clock signal PCLKD is at a high level. Therefore, output signals of the latch circuit 96 are sequentially latched in synchronization with a rising edge of the clock signal PCLKD.

According to the above configuration, the first write data DQRj output from the latch circuit 96 pass through the eight latch circuits (97-3 to 98-0) before being output as write data DQR0. The second write data DQRj output from the latch circuit 96 pass through the six latch circuits (97-3 to 98-1) before being output as write data DQR1. The third write data DQRj output from the latch circuit 96 pass through the four latch circuits (97-3 to 98-2) before being output as write data DQR2. The last write data DQRj output from the latch circuit 96 pass through the two latch circuits (97-3 and 98-3) before being output as write data DQR3. In this manner, the serial-to-parallel conversion is carried out.

When the above serial-to-parallel conversion circuit 90X is used, the command decoder 22 may constantly carry out the clocking of the clock signal PCLKD during the writing operation. As in the case of the enable signal WEB, the clock signal PCLKD is a signal that is supplied from the command decoder 22 to the data input circuit 32 via the long-distance wire. Therefore, the constant clocking of the clock signal PCLKD leads to an increase in the amount of current consumed due to the charging and discharging of the long-distance wire. According to the semiconductor device 10 of the above-described present embodiment, there is no need to use a signal that requires a constant clocking during the writing operation. Therefore, the amount of current consumed by the charging and discharging of the long-distance wire therefore can be reduced according to the semiconductor device 10.

In the serial-to-parallel conversion circuit 90X shown in FIG. 16, all the eight latch circuits 97-0 to 97-3 and 98-0 to 98-3 operate in response to the clock signal PCLKD, thereby consuming a relatively large amount of operation current. In the case of the serial-to-parallel conversion circuit 90R shown in FIG. 12, latch circuits may operate in response to the strobe signals DQSBD0 to DQSBD3 that become sequentially activated. Therefore, the amount of current consumed by the latch circuits can be reduced, too.

In the prototype of the serial-to-parallel conversion circuit 90X shown in FIG. 16, even if the delay time Δt2 is appropriately designed with respect to the transmission delay time Δt1, the setup margin and the hold margin are decreased by effects of variations in the characteristics of each latch circuit because there are a large number of latch circuits 97-0 to 97-3 and 98-0 to 98-3 that operate in synchronization with the clock signal PCLKD. In the semiconductor device 10 of the above-described present embodiment, it is the latch circuit 71 shown in FIG. 9 that receives the enable signal WEB. The strobe signals DQSBD1 to DQSBD3 which are sequentially activated in response to the receiving of the enable signal WEB are in synchronization with the strobe signal DQSBD. Therefore, the deterioration of the setup margin and hold margin associated with variations in the characteristics does not occur.

Incidentally, in the prototype of the serial-to-parallel conversion circuit 90X, the write data DQR0 to DQR3 that have been converted into a parallel format are in synchronization with the clock signal PCLKD. Meanwhile, in the serial-to-parallel conversion circuit 90R of the present embodiment, the write data DQR0 to DQR3 that have been converted into a parallel format are not in synchronization with the clock signal PCLKD. Therefore, according to the present embodiment, the write data may be reloaded onto the clock signal from the strobe signal in the transfer circuit 100R. However, the write data DQR0 to DQR3 that are supplied to the transfer circuit 100R have an expanded data effective width of four clock cycles as a result of the parallel conversion. Thus, a sufficient operation margin can be secured for the reloading, and the deterioration of the characteristics therefore does not occur. FIG. 15 shows the setup time tS and hold time tH of the transfer circuit 100R, proving that a sufficient margin is secured.

Figure 17:
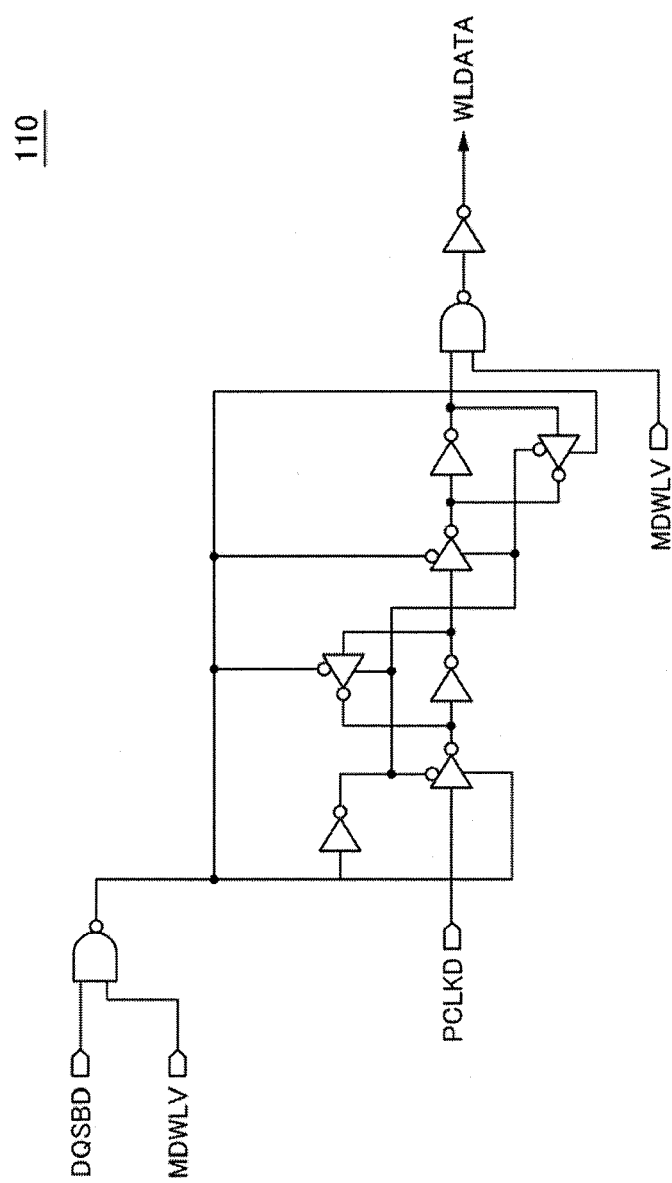
FIG. 17 is a circuit diagram of a write leveling circuit according to an embodiment of the invention that may be used with the serial-to-parallel conversion circuit shown in FIG. 16.

FIG. 17 illustrates a write leveling circuit 110 according to an embodiment of the invention. The write leveling circuit 110 is activated when the write leveling signal MDWLV is at a high level. The write leveling circuit 110 latches the clock signal PCLKD in synchronization with the strobe signal DQSBD to generate write leveling data WLDATA which represents a timing skew. The write leveling circuit 110 shown in FIG. 17 is used to measure an operation timing of the serial-to-parallel conversion circuit 90X shown in FIG. 16. However, the two circuits are different, and have different circuit configurations. As a result, it is difficult to accurately measure a timing skew, and a non-negligible error might occur.

Meanwhile, according to the present embodiment, the serial-to-parallel conversion circuit 90R includes a write leveling function, and can measure a timing skew by using an actual path. Therefore, very accurate measurement results can be obtained.

Incidentally, once a series of writing operations is ended, levels of the strobe signals DQS2 and DQSB2 are not guaranteed by the specifications. Therefore, as indicated by reference symbol A in FIG. 15, a ringing might occur in the strobe signals DQS2 and DQSB2. Even if the ringing occurs, it is desirable that the data input circuit 32 have a circuit configuration that does not malfunction. To realize this, control signal generating circuits 70A and 70B shown in FIGS. 18 and 19 may be used.

Figure 18:
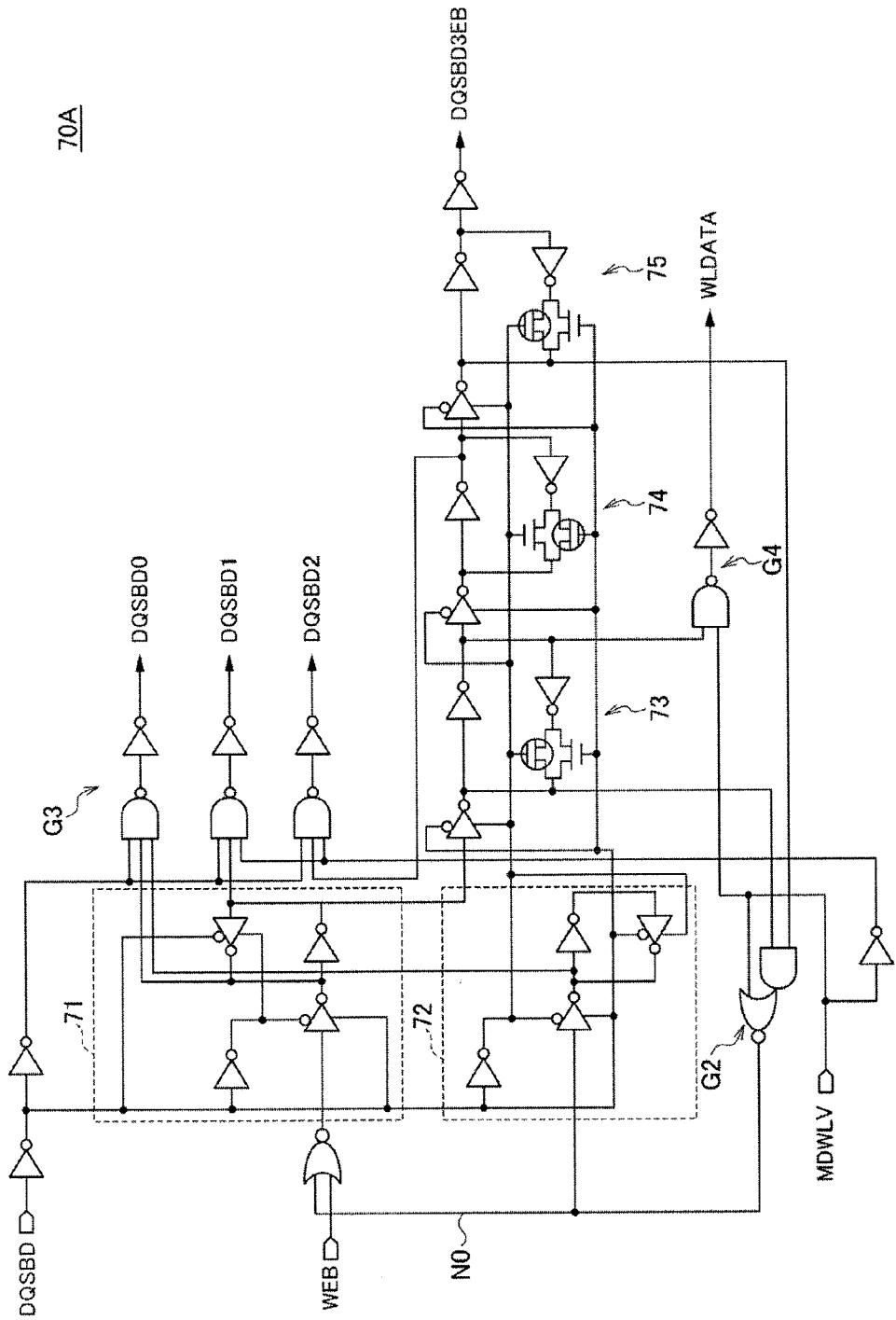
FIG. 18 is a circuit diagram of a control signal generating circuit according to an embodiment of the invention.
Figure 19:
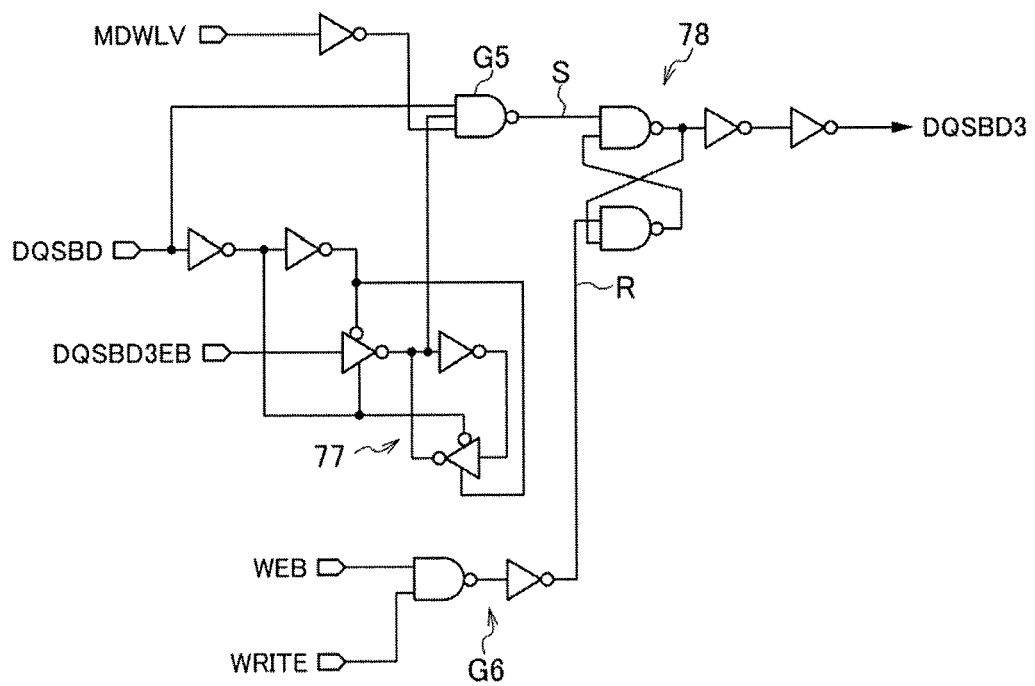
FIG. 19 is a circuit diagram of another control signal generating circuit according to an embodiment of the invention.

The control signal generating circuits 70A and 70B shown in FIGS. 18 and 19 are different from the control signal generating circuit 70 shown in FIG. 9 in that the control signal generating circuits 70A and 70B have a different circuitry portion that generates the strobe signal DQSBD3. FIG. 18 illustrates a control signal generating circuit 70A according to an embodiment of the invention. The control signal generating circuit 70A shown in FIG. 18 is made by removing the latch circuit 76 from the control signal generating circuit 70 shown in FIG. 9, and an output signal DQSBD3EB of the latch circuit 75 is supplied to the control signal generating circuit 70B. FIG. 19 illustrates a control signal generating circuit 70B according to an embodiment of the invention. The control signal generating circuit 70B includes a latch circuit 77 that latches the output signal DQSBD3EB in synchronization with the strobe signal DQSBD; an output signal thereof is supplied to a set terminal S of a SR latch circuit 78 via a gate circuit G5. Therefore, a strobe signal DQSBD3 output from the SR latch circuit 78 is fixed to a high level.

An output signal of a gate circuit G6 that receives the enable signal WEB and the write state signal WRITE is supplied to a reset terminal R of the SR latch circuit 78. Accordingly, until the write state signal WRITE becomes inactivated to a low level due to an issuing of a read command or like, or until the enable signal WEB is changed to a low level in the next writing operation, the logic level of the strobe signal DQSBD3 is fixed to a high level. Therefore, even when a ringing occurs in the strobe signals DQS2 and DQSB2, there is no change in the strobe signal DQSBD3. Thus, even if incorrect data is conveyed due to the ringing, the conveying is stopped by the latch circuit 90-3 shown in FIG. 12. Therefore, the malfunctioning does not occur.

It is apparent that the present invention is not limited to the above embodiments, but may be modified and changed without departing from the scope and spirit of the invention.

What is claimed is:
1. An apparatus comprising:
a first terminal configured to receive a serial write data signal that includes at least four bits transferred in series with each other;
a second terminal configured to receive a data strobe signal;
a third terminal configured to receive a write command;
a fourth terminal configured to receive a clock signal;
a command signal generating circuit configured to produce a first write enable signal in response to the write command and the clock signal, wherein the first write enable signal is less in frequency than the clock signal;
a control circuit configured to produce a plurality of internal data strobe signals in response to the data strobe signal; and
a serial-to-parallel conversion circuit configured to respond to the data strobe and internal data strobe signals to convert the serial write data signal into a parallel write data signal that includes at least four bits produced in parallel to each other.

2. The apparatus as claimed in claim 1, wherein the serial write data signal includes at least eight bits transferred in series with each other and the parallel write data signal includes at least eight bits produced in parallel to each other.

3. The apparatus as claimed in claim 1, further comprising:
a transfer circuit configured to fetch the parallel write data signal in response to the first write enable signal.

4. The apparatus as claimed in claim 1, wherein the command signal generating circuit configured to further produce a second write enable signal in response to the write command, and wherein the second write enable signal is different in phase from the first enable signal and the control circuit configured to produce the internal data strobe signals in response to the data strobe signal and the second write enable signal.

5. The apparatus as claimed in claim 1, further comprising:
first and second rows of terminals being substantially parallel to each other, the first row of the terminals including the first and second terminals and the second row of terminals including the third and fourth terminals; and
a memory cell array being between the first and second rows.

6. The apparatus as claimed in claim 1, wherein the internal data strobe signals are different in phase from each other.

7. An apparatus comprising:
a first row of pads arranged in line and includes first and second pads that are configured to receive a first serial data signal and a first timing signal, respectively;
a second row of pads arranged substantially in parallel to the first row of pads;
an memory cell array being between the first and second rows of pads;
a first control circuit configured to produce a plurality of second timing signals in response to the first timing signal;
a first circuit configured to fetch the first serial data signal in response to the first timing signal and output a second serial data signal; and
a second circuit configured to convert the second serial data signal to a parallel data signal in response to the second timing signals.

8. The apparatus as claimed in claim 7, wherein the second row of pads includes a third terminal that are configured to receive a command;
wherein the apparatus further comprises:
a second control circuit configured to produce an internal command signal in response to the command; and
a third circuit configured to fetch the parallel data signal in response to the internal command signal.

9. The apparatus as claimed in claim 8, wherein the first, second and third circuits and the first control circuit are disposed between the first row of pads and the memory cell array and the second control circuit disposed between the second row of pads and the memory cell array.

10. The apparatus as claimed in claim 8, further comprising an interconnection connecting the second control circuit to the third circuit and extending over the memory cell array.

11. The apparatus as claimed in claim 8, wherein the second row of pads further includes a fourth terminal configured to receive a clock signal, and wherein the second control circuit is configured to produce the internal command signal in response to the command and the clock signal.

12. The apparatus as claimed in claim 9, wherein the internal command signal is less in frequency than the clock signal.

13. The apparatus as claimed in claim 8, wherein the command is a write request, the first timing signal is a data strobe signal.

14. The apparatus as claimed in claim 7, wherein the second timing signals are different in phase from each other.

15. An apparatus comprising:
a first terminal operatively receiving a first serial write data signal that includes first and second write data, each of the first and second write data being at least two bits;
second and third terminals operatively receiving first and second data strobe signals, respectively, the first and second data strobe signals being complementary to each other;
a control circuit operatively producing a plurality of internal data strobe signals in response to at least one of the first and second data strobe signals;
a first data latch coupled to the first terminal at an input node thereof and including first and second latches that are connected in series between the input node thereof and an output node thereof, the first latch operatively responding to the first data strobe signal to fetch the first write data, and the second latch operatively responding to the second data strobe signal to produce a second serial write data signal at the output node of the first data latch, the second serial write data signal including the first write data;
a second data latch coupled to the first terminal at an input node thereof and including a third latch coupled between the input node thereof and an output node thereof, the third latch operatively responding to the second data strobe signal to fetch the second write data and to produce the third serial write data signal at the output node of the second data latch, the third serial write data signal including the second write data;
a first converter coupled to the output node of the first data latch and operatively responding to the internal data strobe signals to convert the second serial write data signal into a first parallel write data signal; and
a second converter coupled to the output node of the second data latch and operatively responding to the internal data strobe signals to convert the third serial write data into a second parallel write data signal.

16. The apparatus as claimed in claim 15, wherein the internal data strobe signals are different in phase from each other.

17. The apparatus as claimed in claim 15, further comprising:
a fourth terminal configured to receive a write command;
a command signal generating circuit configured to produce a write enable signal in response to the write command;
a first transfer circuit coupled to output nodes of the first converter and configured to fetch the first parallel write data signal in response to the write enable signal; and
a second transfer circuit coupled to output nodes of the second converter and configured to fetch the second parallel write data signal in response to the write enable signal.

18. The apparatus as claimed in claim 17, further comprising a fifth terminal configured to receive a clock signal, and wherein the command signal generating circuit is configured to produce the write enable signal in response to the write command and the clock signal.

* * * * *